(12) United States Patent
Antonov et al.

(10) Patent No.: US 9,159,551 B2
(45) Date of Patent: Oct. 13, 2015

(54) METHODS OF FORMING CAPACITORS

(75) Inventors: Vassil Antonov, Boise, ID (US); Vishwanath Bhat, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 633 days.

(21) Appl. No.: 12/496,890

(22) Filed: Jul. 2, 2009

(65) Prior Publication Data
US 2011/0000875 A1    Jan. 6, 2011

(51) Int. Cl.
| | |
|---|---|
| H01G 4/00 | (2006.01) |
| H01G 5/00 | (2006.01) |
| H01G 7/00 | (2006.01) |
| H01G 9/00 | (2006.01) |
| H01G 13/00 | (2013.01) |
| H01B 13/00 | (2006.01) |
| C23F 1/00 | (2006.01) |
| C23F 3/00 | (2006.01) |
| H01L 21/02 | (2006.01) |
| H01L 21/3105 | (2006.01) |
| H01L 49/02 | (2006.01) |

(52) U.S. Cl.
CPC .... H01L 21/02356 (2013.01); H01L 21/02175 (2013.01); H01L 21/3105 (2013.01); H01L 28/65 (2013.01)

(58) Field of Classification Search
USPC .......................................................... 216/13
See application file for complete search history.

(56) References Cited

U.S. PATENT DOCUMENTS

| | | | |
|---|---|---|---|
| 5,109,238 A | 4/1992 | Watanabe et al. | |
| 6,177,351 B1 | 1/2001 | Beratan et al. | |
| 6,320,244 B1 * | 11/2001 | Alers et al. ................. | 257/534 |
| 6,333,259 B1 * | 12/2001 | Izumitani et al. ............ | 438/642 |
| 6,492,241 B1 * | 12/2002 | Rhodes et al. ............... | 438/386 |
| 6,635,497 B2 | 10/2003 | Aggarwal et al. | |
| 7,297,983 B2 | 11/2007 | Hecht et al. | |
| 2003/0213985 A1 * | 11/2003 | Hase ........................... | 257/295 |

(Continued)

FOREIGN PATENT DOCUMENTS

| | | |
|---|---|---|
| CN | 201080029584.5 | 6/2013 |
| KR | 10-0680952 | 2/2007 |

(Continued)

OTHER PUBLICATIONS

"DryEtching" by MIT OpenCourseWare, Nov. 14, 2005.*

(Continued)

*Primary Examiner* — Binh X Tran
*Assistant Examiner* — Thomas Pham
(74) *Attorney, Agent, or Firm* — Wells St. John P.S.

(57) ABSTRACT

A method of forming a capacitor includes depositing a dielectric metal oxide layer of a first phase to a thickness no greater than 75 Angstroms over an inner conductive capacitor electrode material. The first phase dielectric metal oxide layer has a k of at least 15. Conductive $RuO_2$ is deposited over and into physical contact with the dielectric metal oxide layer. Then, the $RuO_2$ and the dielectric metal oxide layer are annealed at a temperature below 500° C. The $RuO_2$ in physical contact with the dielectric metal oxide during the annealing facilitates a change of the dielectric metal oxide layer from the first phase to a second crystalline phase having a higher k than the first phase. The annealed dielectric metal oxide layer is incorporated into a capacitor dielectric region of a capacitor construction. Other implementations are disclosed.

24 Claims, 14 Drawing Sheets

(56) References Cited

U.S. PATENT DOCUMENTS

| | | |
|---|---|---|
| 2005/0032299 A1 | 2/2005 | Basceri et al. |
| 2005/0152094 A1* | 7/2005 | Jeong et al. ............... 361/312 |
| 2006/0014307 A1 | 1/2006 | Kweon |
| 2006/0076597 A1* | 4/2006 | Agarwal et al. ............ 257/296 |
| 2007/0026621 A1 | 2/2007 | Cho et al. |
| 2007/0051998 A1* | 3/2007 | Kil et al. ..................... 257/310 |
| 2007/0065578 A1* | 3/2007 | McDougall ................ 427/248.1 |
| 2007/0096189 A1* | 5/2007 | Iwasaki et al. .............. 257/306 |
| 2007/0259111 A1 | 11/2007 | Singh et al. |
| 2007/0264838 A1* | 11/2007 | Krishnan et al. ............ 438/758 |
| 2007/0293040 A1* | 12/2007 | Emesh et al. ................ 438/627 |
| 2008/0272421 A1* | 11/2008 | Bhat ............................. 257/310 |
| 2009/0065896 A1* | 3/2009 | Hwang ........................ 257/532 |
| 2009/0230555 A1* | 9/2009 | Chapple-Sokol et al. .... 257/751 |
| 2011/0101471 A1* | 5/2011 | Kochupurackal et al. .... 257/411 |
| 2011/0203085 A1* | 8/2011 | Chen et al. .................. 29/25.42 |

FOREIGN PATENT DOCUMENTS

| | | |
|---|---|---|
| KR | 10-0772099 | 11/2007 |
| WO | PCT/US2010/038591 | 1/2011 |
| WO | PCT/US2010/038591 | 1/2012 |

OTHER PUBLICATIONS

Lin et al., "Low Crystallization Temperature for Ta2O5 Thin Films", The Japan Society of Applied Physics, vol. 42, 2003, pp. 7023-7024.

* cited by examiner

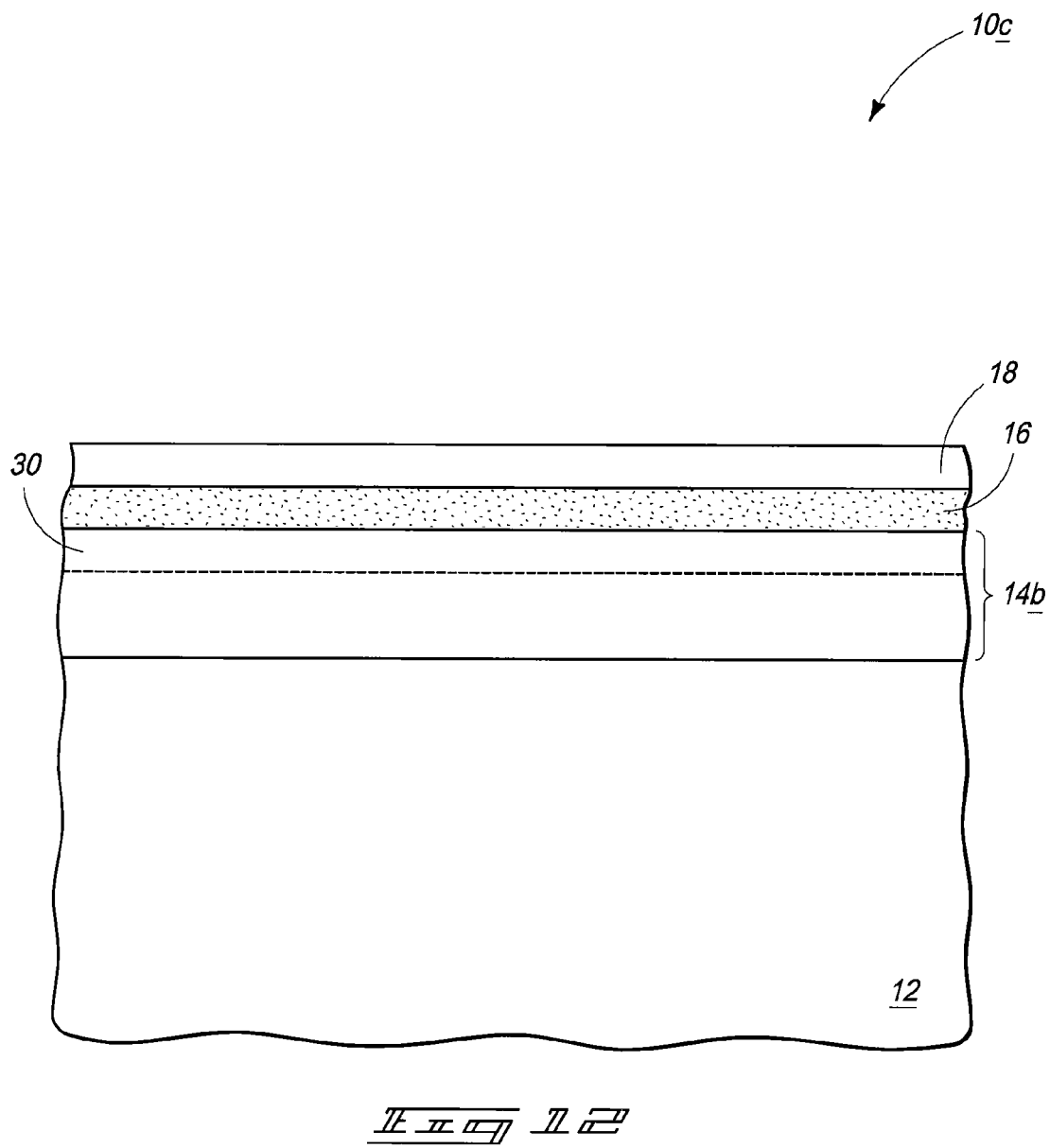

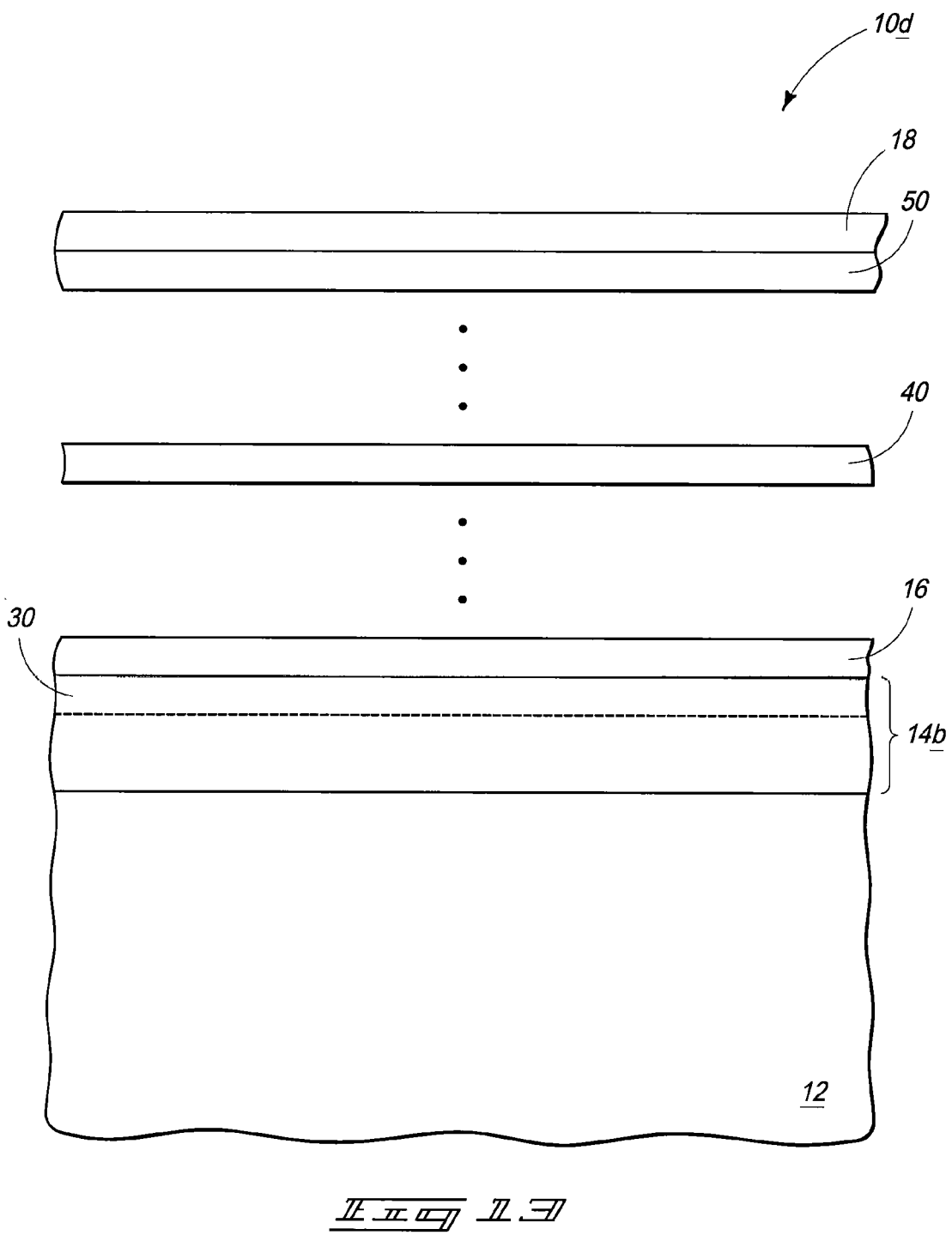

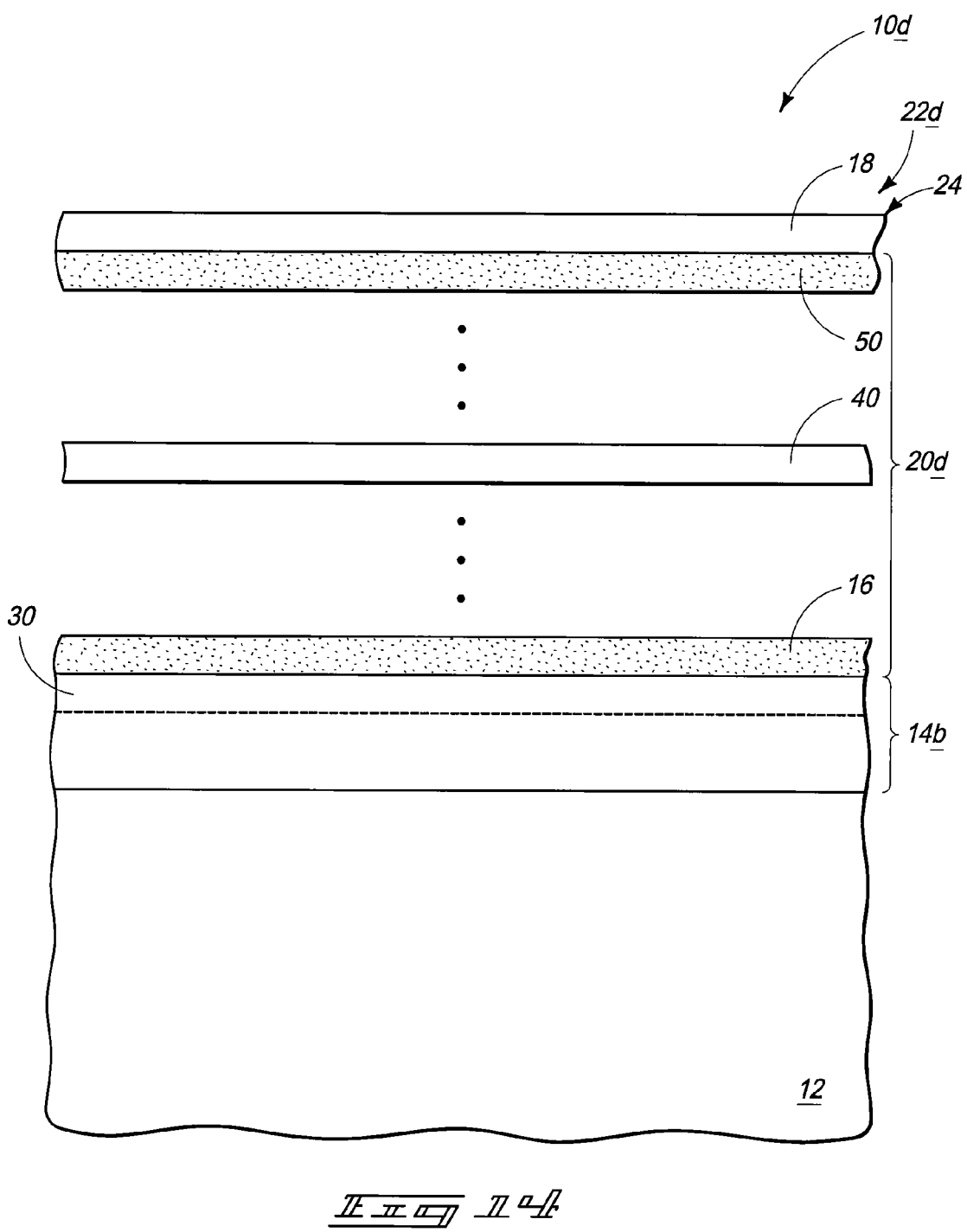

METHODS OF FORMING CAPACITORS

TECHNICAL FIELD

Embodiments disclosed herein pertain to methods of forming capacitors.

BACKGROUND

Capacitors are commonly-used electrical components in semiconductor integrated circuitry, for example memory circuitry such as DRAM circuitry. A typical capacitor is comprised of two conductive electrodes separated by a non-conducting capacitor dielectric region. As integrated circuit density increases, there is a continuing challenge to maintain sufficiently high storage capacitance despite decreasing capacitor area. One way of increasing cell capacitance is through cell structure techniques. Such techniques include 3-dimensional cell capacitors such as trenched and stack capacitors. Other ways of increasing cell capacitance include the development and utilization of new materials for one or both of the capacitor electrodes and the capacitor dielectric region.

One way of maximizing capacitance is to use one or more dielectrics for the capacitor dielectric region which have a very high dielectric constant k. Certain dielectric metal oxides can be used for such purposes. Dielectric metal oxides may occur in multiple different amorphous and crystalline phases, with each phase having a different dielectric constant. It has been discovered in some instances that deposition of dielectric metal oxide layers at and below 75 Angstroms may require subsequent high temperature annealing well in excess of 500° C. to achieve desired highest-k phases for such different materials. Unfortunately, exposure of the substrate to such high temperatures can result in damage of other circuitry components and materials. Accordingly, it would be desirable to develop techniques that enable fabrication of capacitors having high k dielectrics that do not require exposure of substrates to high temperatures after deposition of the capacitor dielectric layers.

BRIEF DESCRIPTION OF THE DRAWINGS

FIG. 12 is a view of the FIG. 11 substrate at a processing step subsequent to that shown by FIG. 11.

FIG. 13 is a diagrammatic sectional view of a substrate in process in accordance with an embodiment of the invention.

FIG. 14 is a diagrammatic sectional view of a substrate in process in accordance with an embodiment of the invention.

DETAILED DESCRIPTION OF EXAMPLE EMBODIMENTS

Figure 1:
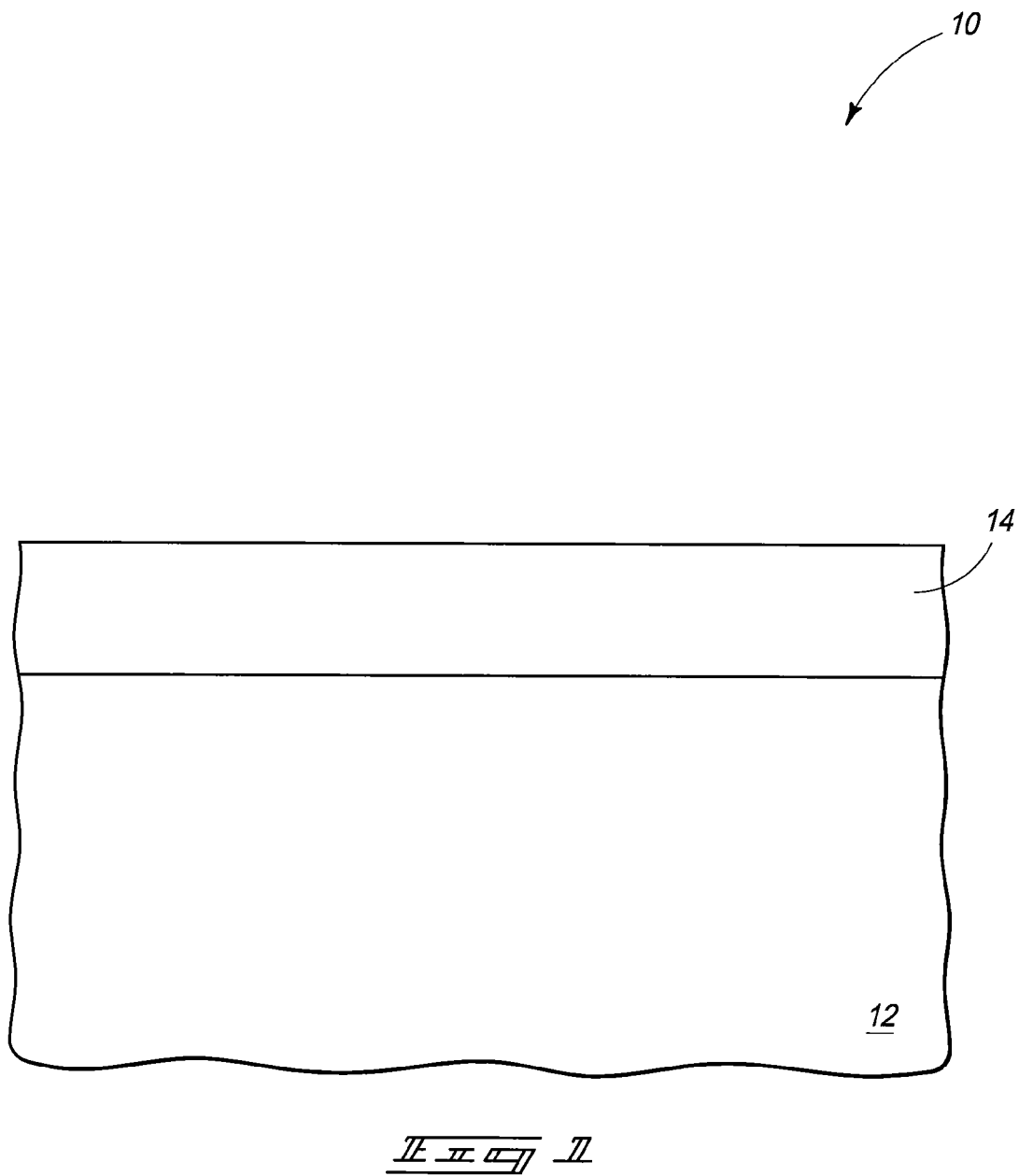
FIG. 1 is a diagrammatic sectional view of a substrate in process in accordance with an embodiment of the invention.

First embodiment methods of forming capacitors are described with reference to FIGS. 1-4. Referring to FIG. 1, a substrate fragment is indicated generally with reference numeral 10, and may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example substrate 10 is depicted as comprising a base material or substrate 12 outwardly of which a capacitor will be formed. Substrate 12 will likely comprise multiple different composition materials and layers which may be insulative, conductive, and/or semiconductive.

An inner conductive capacitor electrode material 14 has been deposited over substrate 12. Such may be homogenous or non-homogenous, with conductively doped semiconductive materials and one or more metals being examples. In the context of this document, a "metal" encompasses elemental form metals, alloys of elemental metals, and one or more conductive metal compounds. Examples include conductively doped silicon, titanium, tungsten, conductive metal nitrides, platinum, ruthenium, and conductive metal oxides. An example thickness range for inner conductive capacitor electrode material 14 is from 50 Angstroms to 300 Angstroms.

Figure 2:
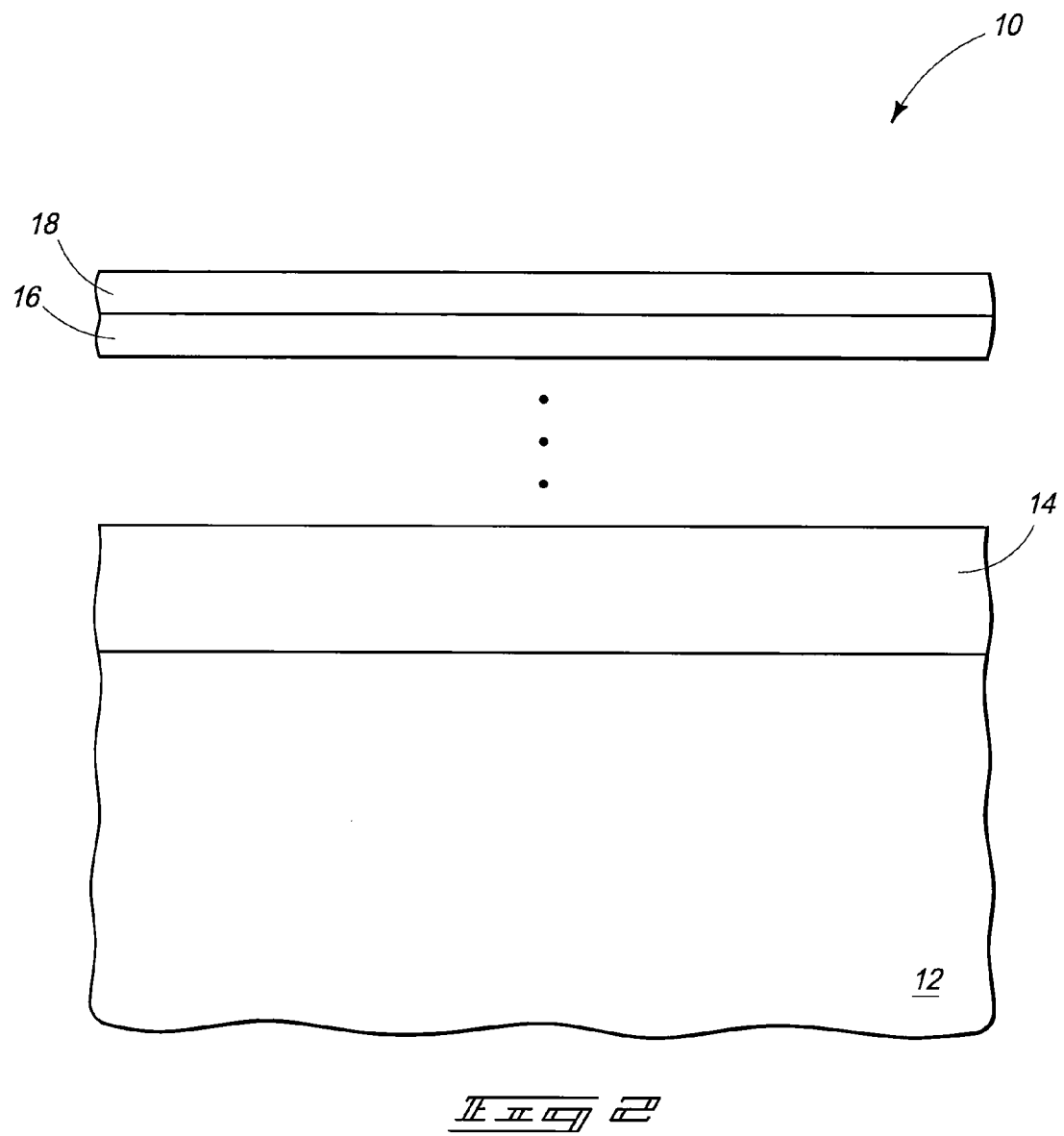
FIG. 2 is a view of the FIG. 1 substrate at a processing step subsequent to that shown by FIG. 1.

Referring to FIG. 2, a dielectric metal oxide layer 16 of a first phase has been deposited to a thickness no greater than 75 Angstroms over inner conductive capacitor electrode material 14. First phase dielectric metal oxide layer 16 has a dielectric constant "k" of at least 15. Dielectric layer 16 may or may not be placed into direct physical touching contact with inner conductive capacitor electrode material 14. Accordingly, one or more different capacitor dielectric materials may be provided intermediate first phase dielectric metal oxide layer 16 and conductive capacitor electrode material 14, for example as indicated by the three vertical dots between layers 14 and 16. Regardless, in one embodiment, thickness of dielectric metal oxide layer 16 is no greater than 60 Angstroms, and in one embodiment is no greater than 50 Angstroms.

The first phase of dielectric metal oxide layer 16 may be amorphous or crystalline. Regardless, the metal oxide of layer 16 may only contain a single metal element, or may comprise multiple metal elements. Specific high k dielectric example materials for layer 16 having a k of at least 15 include at least one of $ZrO_2$, $TiO_2$, $Ta_2O_5$, $HfO_2$, and $Nb_2O_5$.

Dielectric metal oxide layer 16 may be deposited by any existing or yet-to-be developed manner, with one or a combination of chemical vapor deposition and atomic layer deposition being examples. Any suitable precursors may be used, for example metal halides and metalorganics as metal-containing precursors, and compounds comprising oxygen materials may be used as oxygen-containing precursors. For example for $ZrO_2$, example chemical vapor deposition or atomic layer deposition precursors for zirconium include zirconium tetrachloride, tris(dimethyl-amido)(cyclopentadienyl)zirconium, tris(dimethyl-amido)(methyl-cyclopentadienyl)zirconium, tris(dimethyl-amido)(ethyl-cyclopentadienyl)zirconium, tetraethyl methyl amido zirconium, and tetrakis dimethyl amido zirconium. Example oxygen-containing precursors include $O_2$, $O_3$ and $H_2O$. Mixtures of two or more of the various precursors may also of course be used. By way of examples only, deposition conditions include a substrate temperature from 250° C. to 350° C. and sub-atmospheric chamber pressure from 0.5 Torr to 5 Torr.

Still referring to FIG. 2, conductive $RuO_2$ 18 has been deposited over and into physical contact with dielectric metal oxide layer 16. Such may be of any amorphous or crystalline phase as-deposited. In one embodiment, thickness of $RuO_2$ 18 is at least 50 Angstroms. In one embodiment, thickness of $RuO_2$ is from 75 Angstroms to 300 Angstroms, with a more specific ideal embodiment being from 100 Angstroms to 150 Angstroms.

$RuO_2$ 18 may be deposited by any existing or yet-to-be developed manner, with one or both of the atomic layer deposition and chemical vapor deposition being examples. Example temperature, pressure and oxygen-containing precursors may be the same as those described above for deposition of dielectric metal oxide layer 16. Example ruthenium-containing precursors include bis(cyclopentadienyl)ruthenium, bis(ethyl-cyclopentadienyl)ruthenium, bis(dimethyl-pentadienyl)ruthenium, tris(tetra-methyl-heptanedionate)ruthenium, (dimethyl-pentadienyl)(ethyl-cyclopentadienyl)ruthenium, (methyl-cyclopentadienyl)(pyrrolyl)ruthenium, (tetraethylmethylamido)ruthenium, and (tetrakisdimethylamido)ruthenium.

Figure 3:
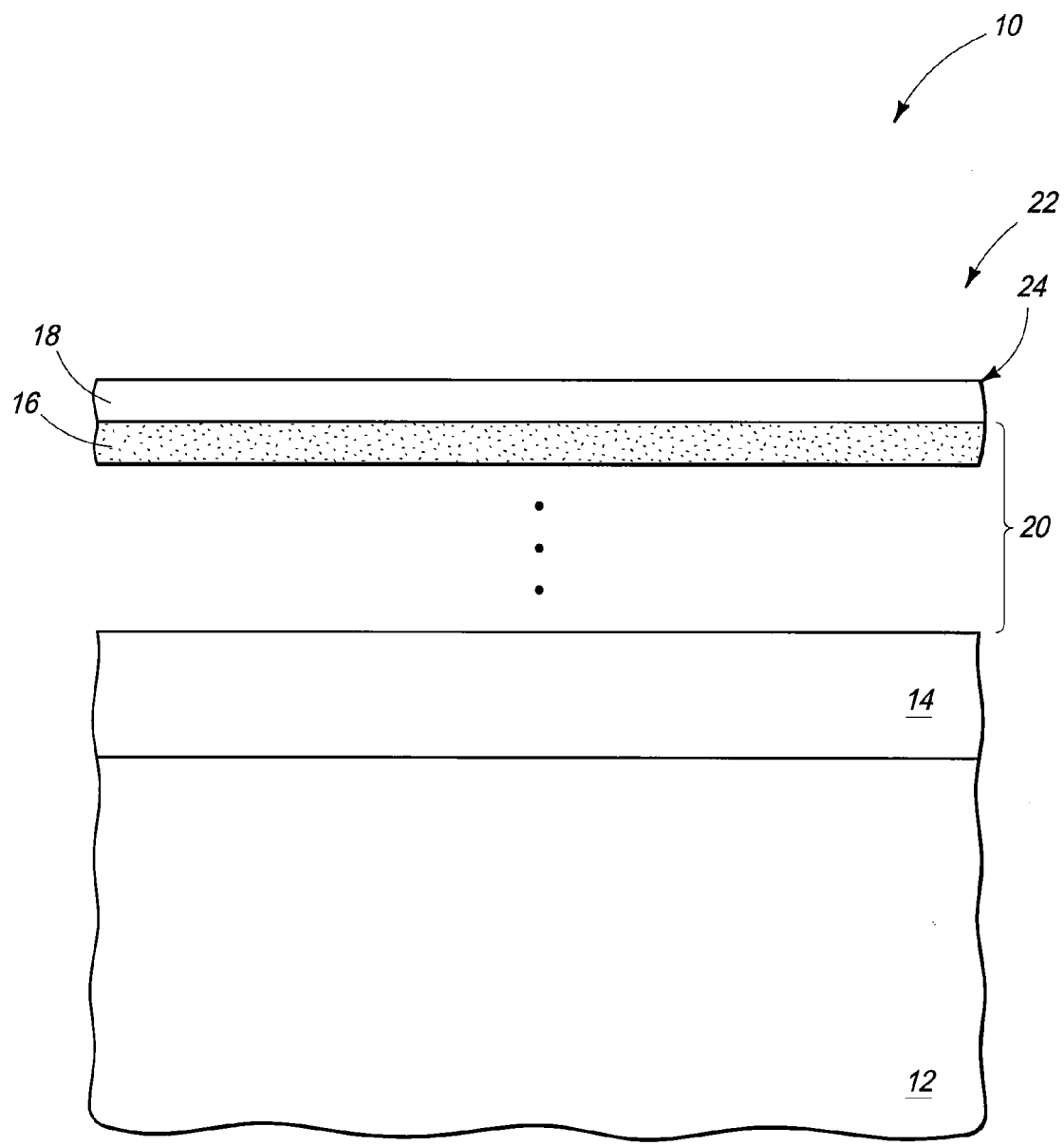
FIG. 3 is a view of the FIG. 2 substrate at a processing step subsequent to that shown by FIG. 2.

Referring to FIG. 3, $RuO_2$ 18 and dielectric metal oxide layer 16 have been annealed at a temperature below 500° C. The $RuO_2$ 18 in physical contact with the dielectric metal oxide of layer 16 during the annealing has facilitated or imparted a change of dielectric metal oxide layer 16 from the first phase to a second crystalline phase which has a higher k than the first phase. Such is exemplified in FIG. 3 by showing dielectric metal oxide layer 16 as being stippled in comparison to FIG. 2. In one embodiment, the annealing is conducted at a temperature of at least 200° C., and in one embodiment at a temperature of no greater than 400° C. Pressure may be atmospheric, subatmospheric, or greater than atmospheric, and the ambient during the annealing may be inert or not inert.

In one embodiment wherein the $RuO_2$ as-deposited is amorphous, such will become crystalline as a result of the annealing. In one embodiment, the second crystalline phase is tetragonal and the $RuO_2$ as-deposited is of a phase other than tetragonal. The annealing in such embodiment changes the phase of the $RuO_2$ to tetragonal.

It has been discovered that provision of a $RuO_2$ layer in direct physical touching contact with a dielectric metal oxide layer having a k of at least 15, and where the metal oxide layer has a thickness no greater than 75 Angstroms, can significantly reduce the time and temperature to which the metal oxide layer must be exposed to achieve a desired highest-k crystalline state. For example, $ZrO_2$ deposited to a thickness of 70 Angstroms or less deposits into one of an amorphous, monoclinic, or cubic phase as opposed to a highest-k and desired tetragonal phase. In the absence of direct physical touching contact with a $RuO_2$ layer, the $ZrO_2$ layer as-deposited must be subjected to a temperature of at least 600° C. for at least 5 minutes to achieve complete transformation to the tetragonal phase. Provision of a $RuO_2$ layer in direct physical touching contact therewith enables temperatures below 500° C. to be used.

As specific examples, a 150 Angstrom thick $RuO_2$ layer received over a 50 Angstrom thick layer of $ZrO_2$ will transform such $ZrO_2$ layer to the tetragonal phase in any ambient or any pressure with an annealing temperature of 250° C. in 5 minutes or less. If the same as-deposited $ZrO_2$ layer of 50 Angstroms is contacted by a 100 Angstrom thick layer of $RuO_2$, exposure to a temperature of 400° C. for 5 minutes or less will result in transformation to the desired tetragonal phase.

The second crystalline phase may be tetragonal, hexagonal, or other, for example depending upon the composition of the dielectric metal oxide. For example, for $TiO_2$, $HFO_2$, and $ZrO_2$, the desired highest-k phase is tetragonal. With respect to $Ta_2O_5$ and $Nb_2O_5$, the highest-k crystalline phase is hexagonal.

The above stated act of annealing may be conducted as a dedicated anneal for the specific and/or sole purpose of transformation to the higher k second crystalline phase. Alternately, such annealing may inherently result from subsequent processing of the substrate for one or more other purposes. For example, deposition of additional layers at temperatures greater than room temperature and below 500° C. may result in or constitute the stated above act of annealing. For example, if an outer capacitor electrode material of one or both of conductively doped polysilicon and titanium nitride were deposited, such may be conducted at a temperature and for a sufficient period of time to provide the stated act of annealing.

Figure 4:
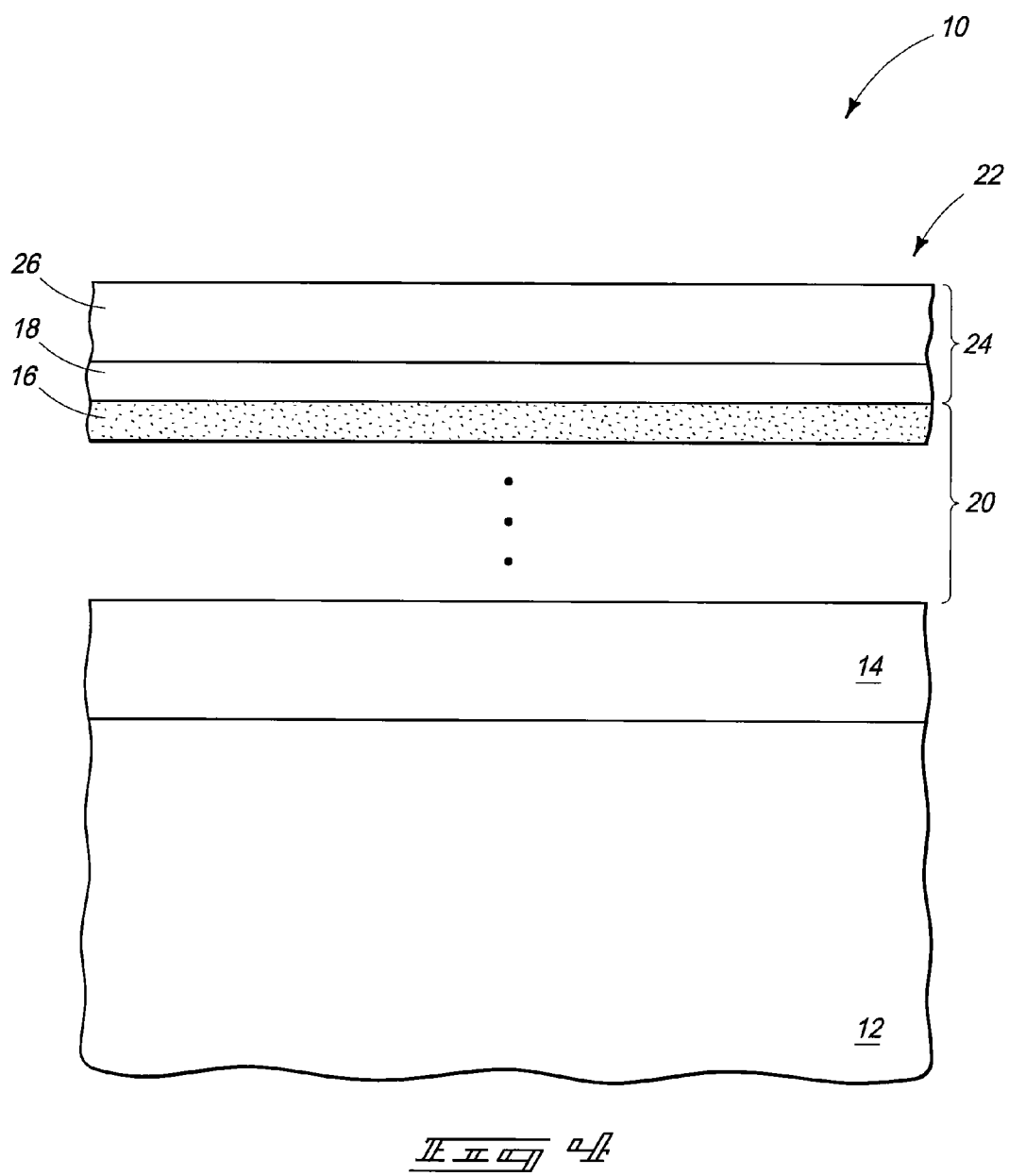
FIG. 4 is a view of the FIG. 3 substrate at a processing step subsequent to that shown by FIG. 3.

Regardless, annealed dielectric metal oxide layer 16 will be incorporated into a capacitor dielectric region of a capacitor construction. For example, FIG. 3 depicts annealed dielectric metal oxide layer 16 as comprising a portion of a capacitor dielectric region 20 of a capacitor construction 22. Capacitor dielectric region 20 may only be constituted by annealed dielectric metal oxide layer 16, or may include one or more additional materials between annealed dielectric metal oxide layer 16 and inner conductive capacitor electrode material 14. Regardless, capacitor construction 22 in FIG. 3 is depicted as comprising capacitor dielectric region 20, inner conductive capacitor electrode material 14, and an outer conductive capacitor electrode 24 which comprises the annealed conductive $RuO_2$ 18. One or more additional conductive materials may be added to comprise a portion of outer conductive capacitor electrode 24. For example as shown in FIG. 4, conductive material 26 has been deposited over $RuO_2$ 18 to comprise a portion of outer conductive capacitor electrode 24. Conductive material 26 may be homogenous or non-homogenous, comprising one or more different composition conductive layers and materials. In one embodiment, material 26 may comprise or consist essentially of additional $RuO_2$.

Figure 5:
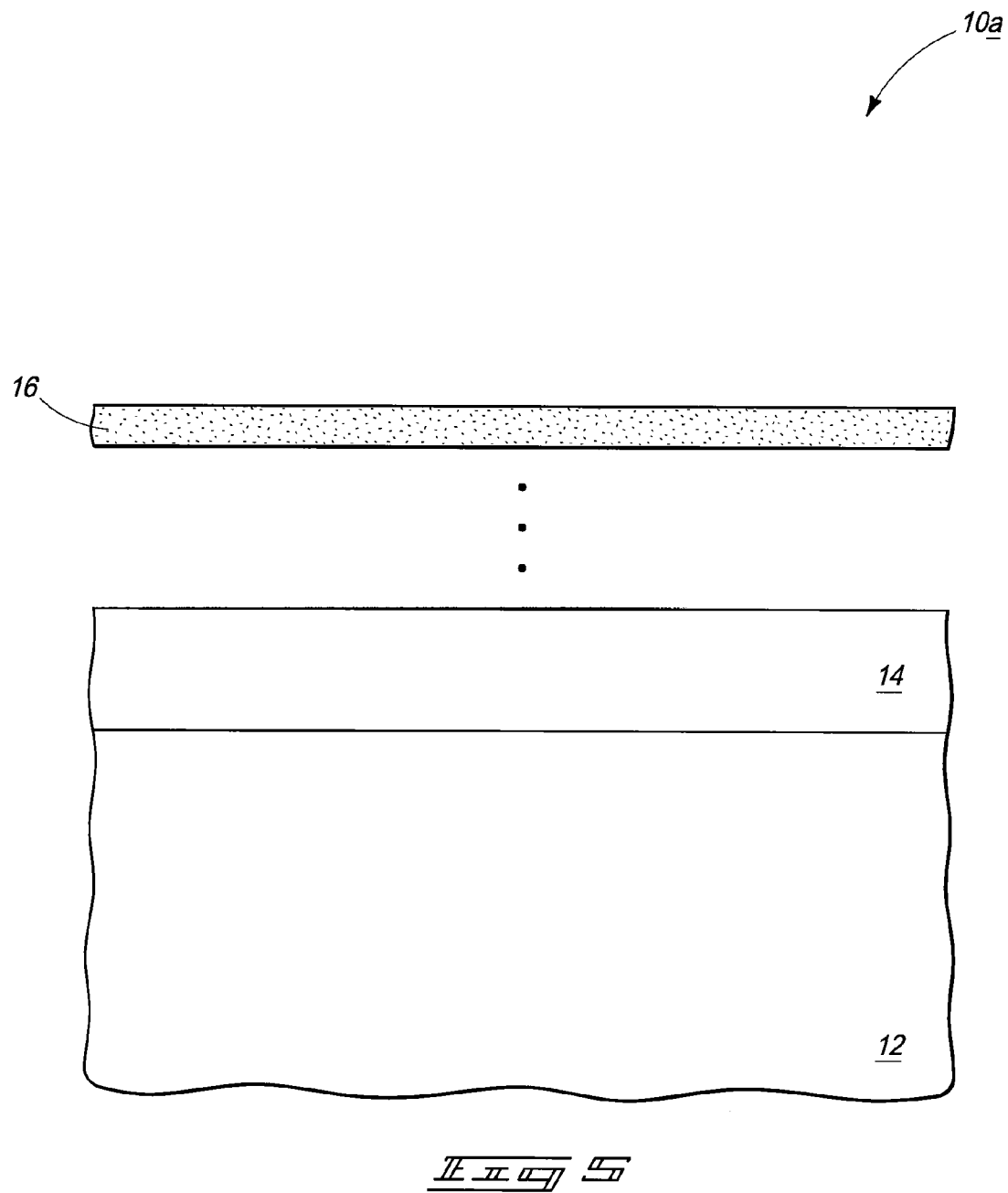
FIG. 5 is a diagrammatic sectional view of a substrate in process in accordance with an embodiment of the invention.
Figure 6:
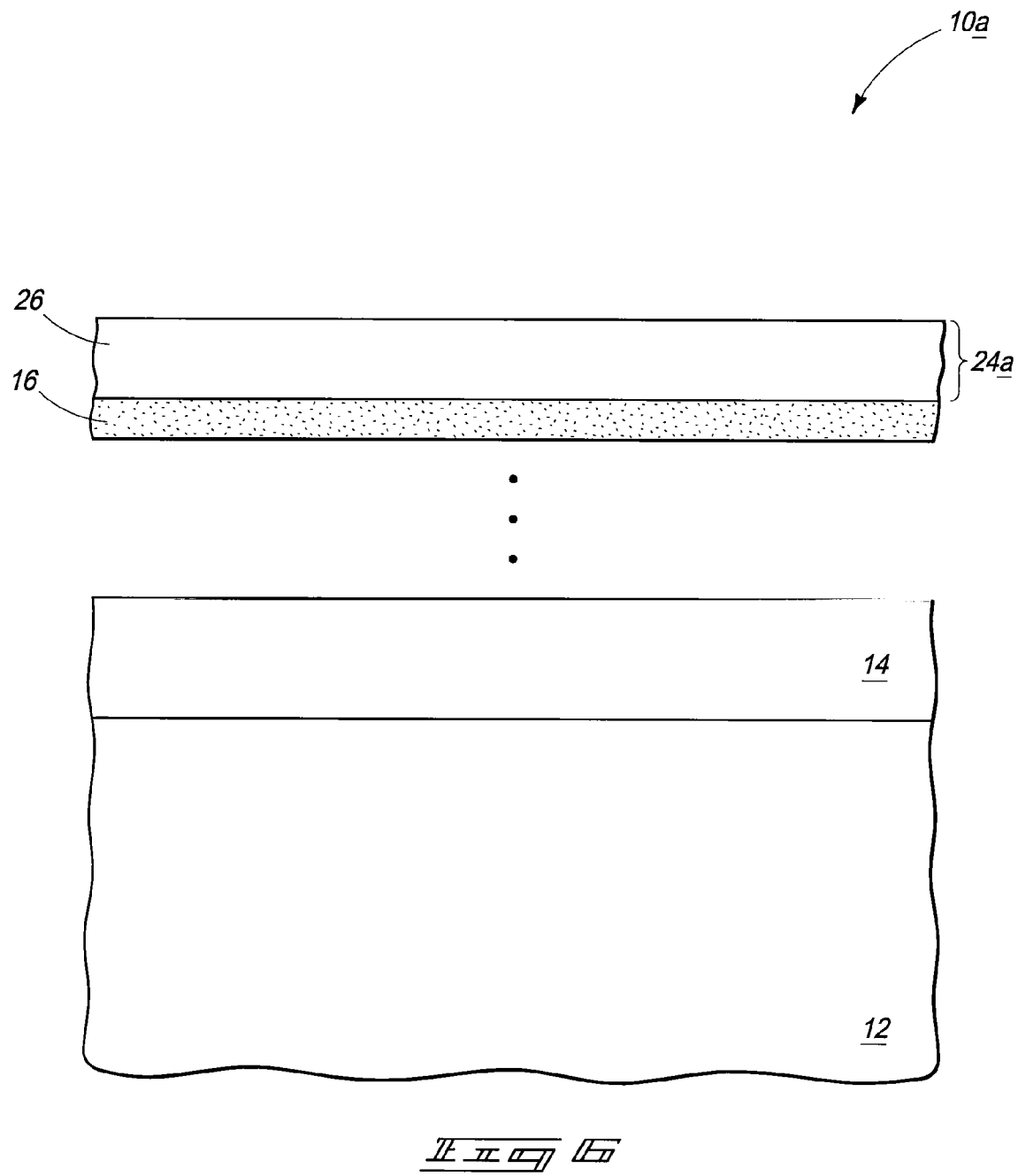
FIG. 6 is a view of the FIG. 5 substrate at a processing step subsequent to that shown by FIG. 5.

In some embodiments, $RuO_2$ may not be desired in a finished capacitor construction to comprise a portion of the outer capacitor electrode. Alternately if $RuO_2$ is desired to be a composition of an outer capacitor electrode, it may be desired that such not be in direct physical touching contact with the capacitor dielectric region in the finished capacitor construction. Accordingly, after the above stated act of annealing, at least some or perhaps all of the annealed $RuO_2$ may be etched from the substrate. For example, FIGS. 5 and 6 depict an alternate example method of forming a capacitor with respect to a substrate fragment 10a. Like numerals from the first described embodiments have been used where appropriate, with some construction differences being indicated with the suffix "a" or with different numerals. FIG. 5 depicts processing immediately subsequent to that depicted by FIG. 3, and wherein all of RuO$_2$ 18 (not shown) has been etched from the substrate. Only some of RuO$_2$ 18 may be etched away, although FIG. 5 shows all of such being etched away. An example etching chemistry that will etch RuO$_2$ selectively relative to other dielectric metal oxide materials comprises O$_3$, for example a mixture of O$_2$ and O$_3$ where O$_3$ is from 18 percent to 22 percent by volume of such mixture.

Referring to FIG. 6, conductive material 26 has been deposited over annealed dielectric metal oxide layer 16, thereby forming outer conductive capacitor electrode 24a.

Figure 7:
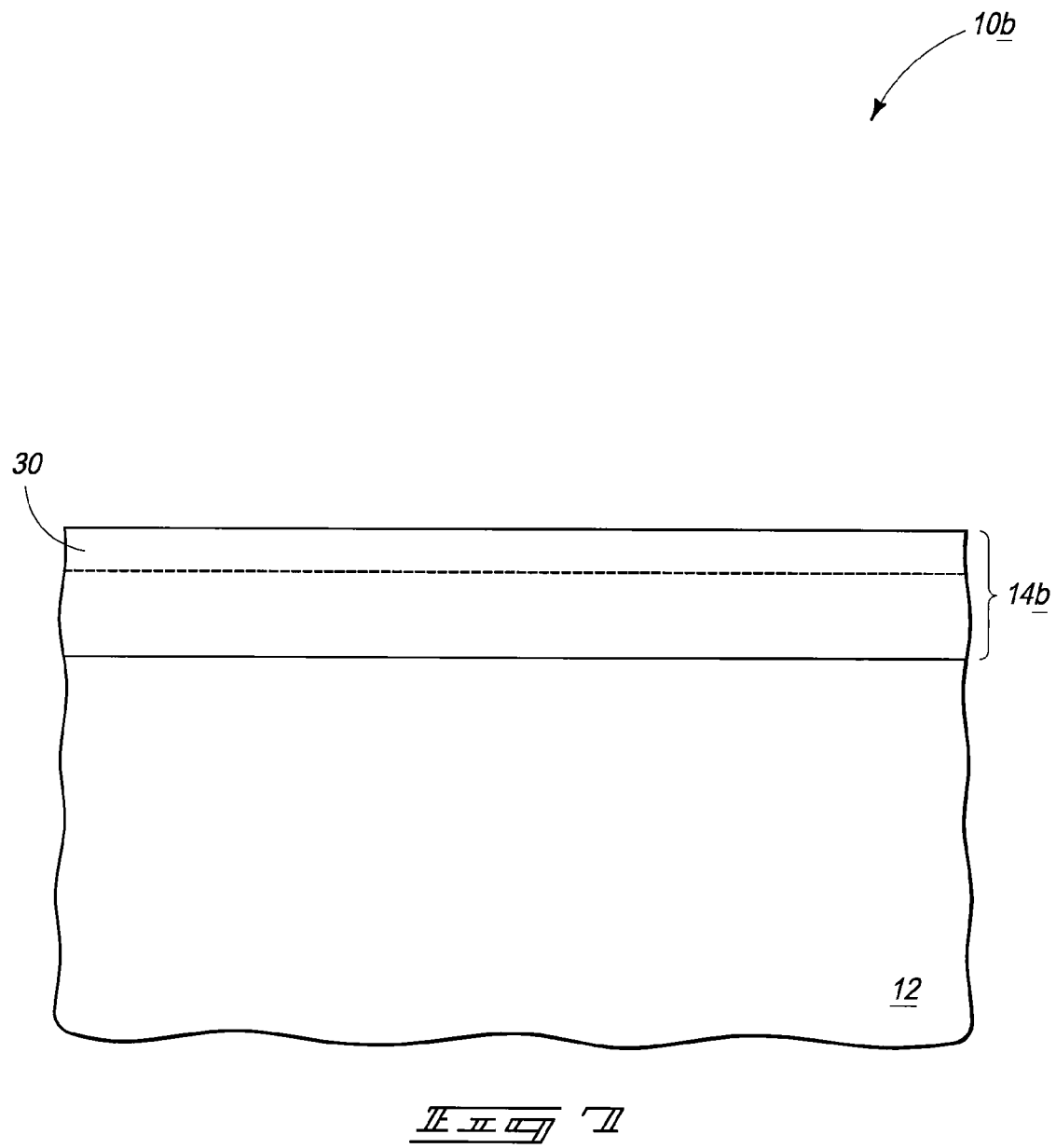
FIG. 7 is a diagrammatic sectional view of a substrate in process in accordance with an embodiment of the invention.

Example additional embodiments of methods of forming capacitors are next described with reference to FIGS. 7-10 with respect to a substrate fragment 10b. Like numerals from the above described embodiments have been used where appropriate, with some construction differences being indicated with the suffix "b" or with different numerals. Referring to FIG. 7, inner conductive capacitor electrode material 14b has been deposited over substrate 12. Material 14b may be the same as that of material 14 and will have some outermost portion 30 thereof which comprises RuO$_2$. Outermost portion 30 may be of any suitable thickness, with example thickness ranges provided above for RuO$_2$ material 18 being examples.

Figure 8:
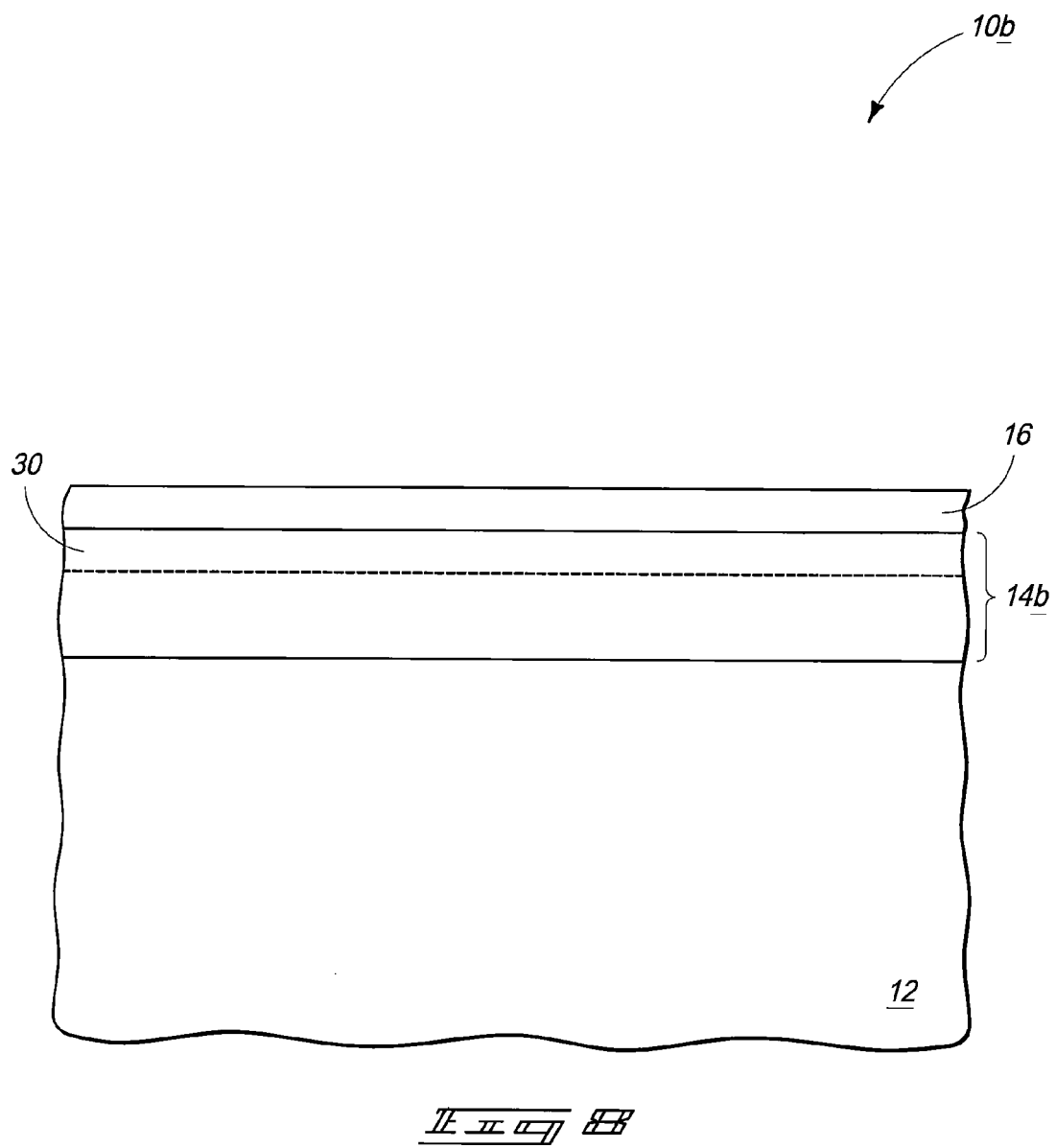
FIG. 8 is a view of the FIG. 7 substrate at a processing step subsequent to that shown by FIG. 7.

Referring to FIG. 8, dielectric metal oxide layer 16 of a first phase has been deposited to a thickness no greater than 75 Angstroms over and into physical contact with the RuO$_2$ 30 of inner conductive capacitor electrode material 14b.

Figure 9:
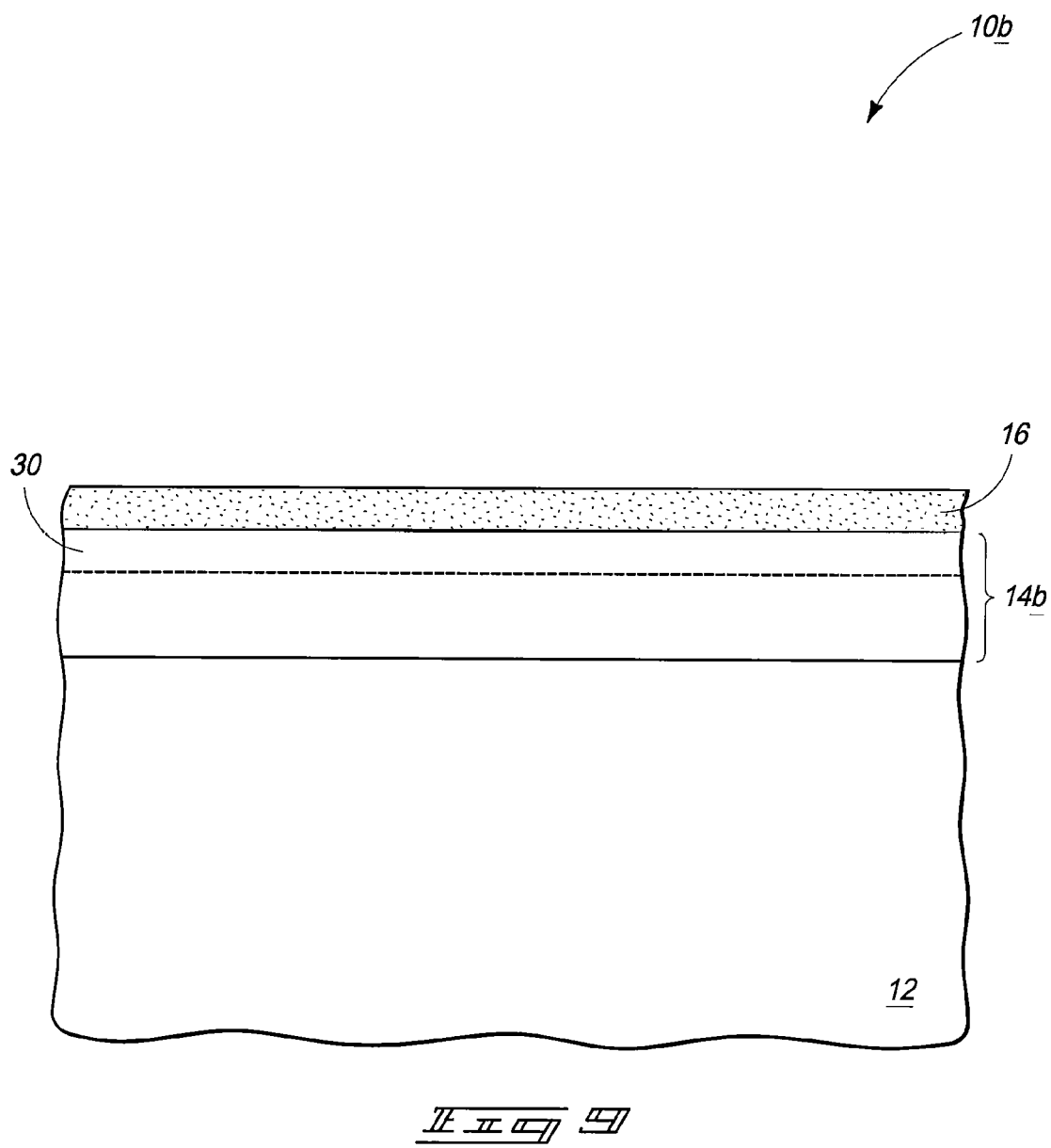
FIG. 9 is a view of the FIG. 8 substrate at a processing step subsequent to that shown by FIG. 8.

Referring to FIG. 9, RuO$_2$ 30 and dielectric metal oxide layer 16 have been annealed at a temperature below 500° C. The RuO$_2$ 30 in physical contact with dielectric metal oxide of layer 16 during the annealing has facilitated or imparted a change of the dielectric metal oxide layer 16 from the first phase to a second crystalline phase having a higher k than the first phase. Example processing is as described above with respect to the first-described embodiments.

The annealed dielectric metal oxide layer 16 of second crystalline phase of higher k may be incorporated into some of all of a capacitor dielectric region of a capacitor construction comprising inner and outer capacitor electrodes. Accordingly, outer conductive capacitor electrode material will be deposited over the dielectric metal oxide layer. Intervening materials or layers may be received between the outer conductive capacitor electrode material and the dielectric metal oxide layer 16 which was subjected to the phase transforming annealing. Alternately, the dielectric metal oxide layer subjected to the phase transforming annealing may be in direct physical touching contact with the outer conductive capacitor electrode material.

Figure 10:
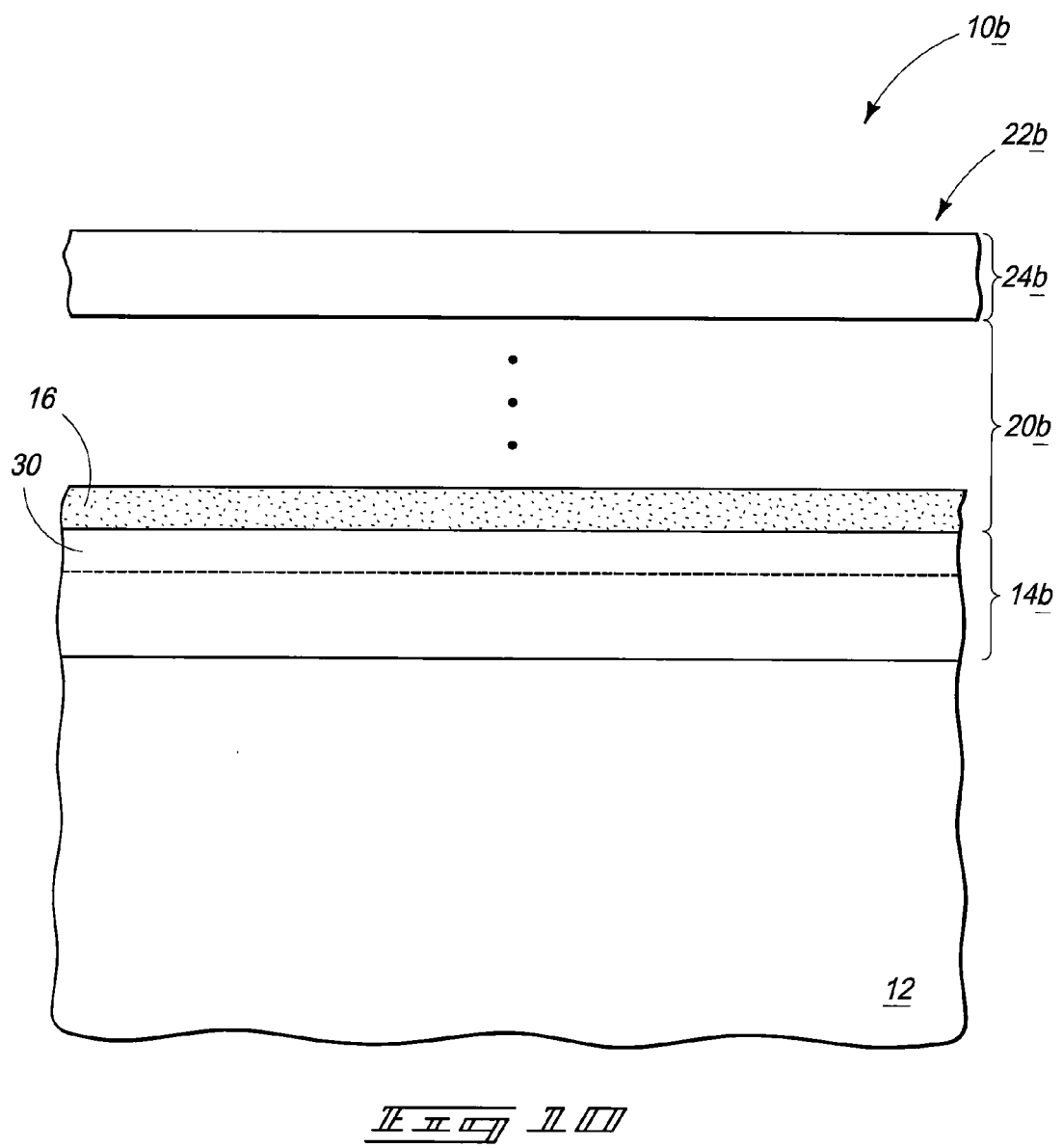
FIG. 10 is a view of the FIG. 9 substrate at a processing step subsequent to that shown by FIG. 9.

FIG. 10 depicts a capacitor construction 22b comprising inner conductive capacitor electrode material 14b, outer conductive capacitor electrode 24b, and having a capacitor dielectric region 20b received there-between. Annealed dielectric metal oxide layer 16 comprises a portion of capacitor dielectric region 20b, and one or more other materials or layers may be received thereover as indicated by the three vertically arranged dots. Alternately, outer conductive capacitor electrode 24b may be in direct physical contact with annealed dielectric metal oxide 16. Further and regardless, the above stated act of annealing in the embodiments of FIGS. 7-10 may be conducted as a dedicated anneal, and regardless the annealing may occur before, during or after deposition of outer conductive capacitor electrode 24b.

RuO$_2$ may be etched appreciably using O$_3$. Accordingly in one embodiment wherein a dielectric metal oxide layer is deposited over RuO$_2$, it may be desired in such a deposition to at least start the deposition using an oxygen-containing precursor which is void of O$_3$, for example to avoid etching of RuO$_2$. In one embodiment after the inner conductive capacitor electrode material is covered with dielectric metal oxide using an oxygen-containing precursor which is void of O$_3$, depositing of the dielectric metal oxide layer may be continued using O$_3$.

Figure 11:
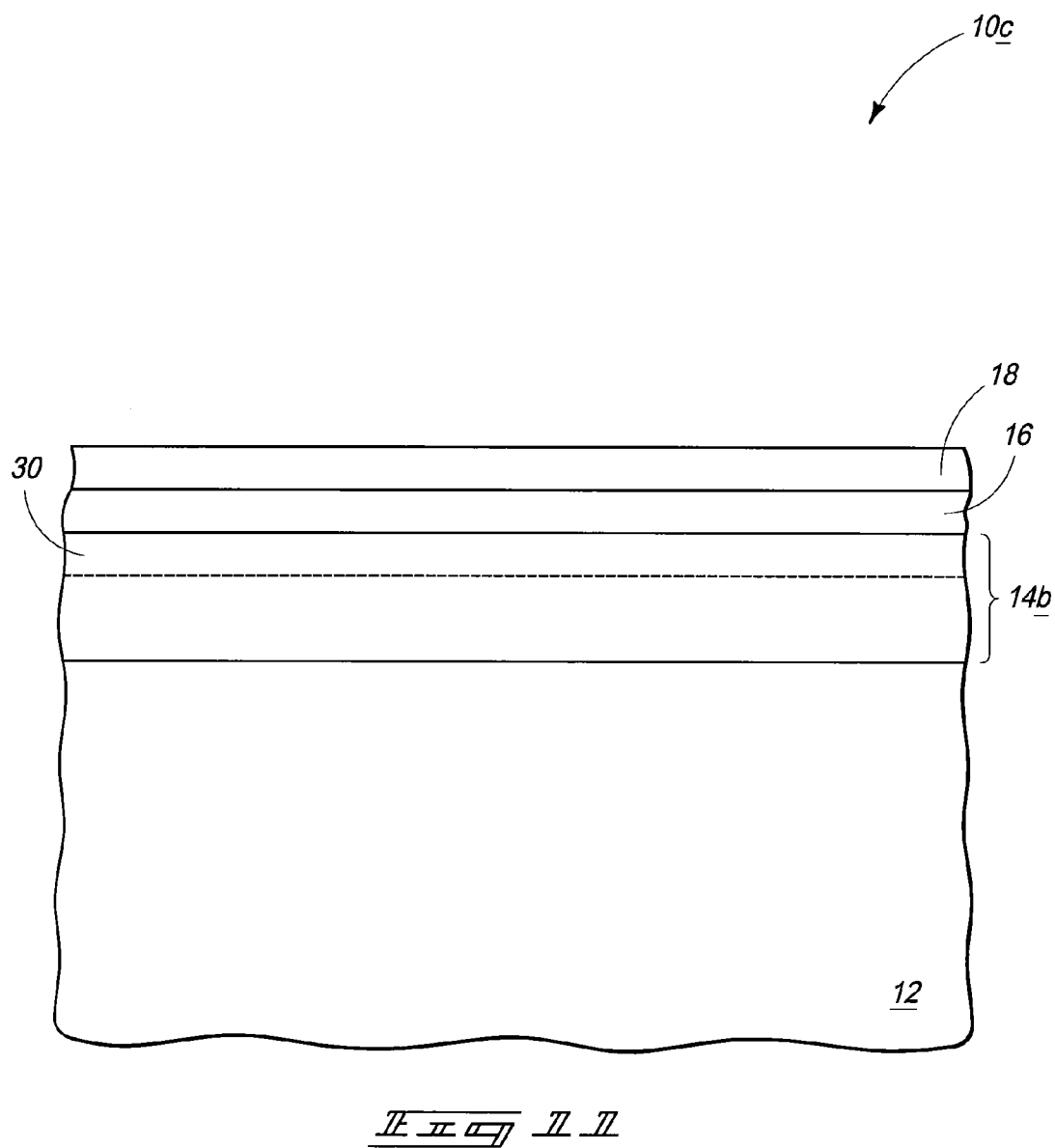
FIG. 11 is a diagrammatic sectional view of a substrate in process in accordance with an embodiment of the invention.

It may be desirable to provide RuO$_2$ in physical contact both above and below a dielectric metal oxide layer when the above annealing is conducted. FIGS. 11 and 12 show an example such embodiment with respect to a substrate fragment 10c. Like numerals from the above-described embodiments have been used where appropriate, with some construction differences being indicated with the suffix "c" or with different numerals. FIG. 11 depicts processing as may occur immediately subsequent to that shown by FIG. 8. Specifically, conductive RuO$_2$ 18 has been deposited over and into physical contact with dielectric metal oxide layer 16.

Referring to FIG. 12, RuO$_2$ 18 and 30 and dielectric metal oxide layer 16 have been annealed as described above to form the second crystalline phase having a higher k than the first crystalline phase. Some or all of RuO$_2$ 18 may be etched away from the substrate, for example as described above in connection with respect to the embodiment of FIGS. 5 and 6. Alternately or additionally, RuO$_2$ 18 may comprise some or all of an outer conductive capacitor electrode material.

FIG. 13 depicts an additional alternate embodiment substrate fragment 10d to that shown in the processing described with reference to FIGS. 11 and 12. Like numerals from the above-described embodiments have been used where appropriate, with some construction differences being indicated with the suffix "d" or with different numerals. In FIG. 13, an inner conductive capacitor electrode material 14b has been deposited which comprises RuO$_2$ 30 as an outermost portion thereof. A first dielectric metal oxide layer 16 of a first phase has been deposited to a thickness no greater than 75 Angstroms over and into physical contact with RuO$_2$ 30.

One or more additional or different composition dielectric layers are provided over first dielectric metal oxide layer 16. For example in the FIG. 13 embodiment, at least a second dielectric layer 40 has been deposited over first dielectric metal oxide layer 16, wherein second dielectric layer 40 is of different composition from that of first dielectric metal oxide layer 16. Ideally, second dielectric layer 40 is a high k dielectric having a k of at least 15, and regardless may or may not comprise a dielectric metal oxide. One or more additional dielectric layers may be provided between second dielectric layer 40 and first dielectric metal oxide layer 16, for example as indicated by the three vertical dots between layers 16 and 40.

A third dielectric metal oxide layer 50 is deposited to a thickness no greater than 75 Angstroms over second dielectric layer 40. Intervening dielectric layers may be provided between layers 50 and 40 as indicated by the three vertical dots between layers 50 and 40. Regardless, third dielectric metal oxide layer 50 is of different composition from that of second dielectric layer 40, and has a k of at least 15. First and second dielectric metal oxide layers 16 and 50 may be of the same composition or may be of different compositions. Further, such may be of the same or different thicknesses.

Conductive RuO$_2$ 18 has been deposited over and into physical contact with third dielectric metal oxide layer 50. Thereafter, the substrate is annealed at a temperature below 500° C. The RuO$_2$ 30 in physical contact with first dielectric metal oxide layer 16 during the annealing facilitates or imparts a change of first dielectric metal oxide layer 16 from the first phase to a second crystalline phase having a higher k than the first phase. Likewise, RuO$_2$ 18 in physical contact with third dielectric metal oxide layer 50 during the annealing facilitates or imparts a change of the third dielectric metal oxide layer 50 from a third phase to a fourth crystalline phase having a higher k than the third phase. The first and third phases may be the same or may be different from one another. Regardless, processing may occur in any manner described above, and FIG. 14 depicts annealing having occurred of the FIG. 13 substrate.

In one embodiment, the annealed first, second and third dielectric layers are incorporated into a capacitor dielectric region 20d of a capacitor construction 22d comprising inner conductive capacitor electrode material 14b comprising $RuO_2$ 30 and an outer conductive capacitor electrode material 24 comprising conductive $RuO_2$ 18. Additional conductive layers may or may not be provided over $RuO_2$ layer 18 as part of such outer conductive capacitor electrode.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a capacitor, comprising:
depositing inner conductive capacitor electrode material over a substrate, the inner conductive capacitor electrode material being selected from the group consisting of conductively doped silicon, elemental titanium, elemental tungsten, elemental ruthenium, elemental platinum, and mixtures thereof;
depositing a dielectric metal oxide layer of a first phase to a thickness no greater than 75 Angstroms over the inner conductive capacitor electrode material, the first phase dielectric metal oxide layer having a k of at least 15 and comprising one or more of $HfO_2$, $TiO_2$, $ZrO_2$, $Ta_2O_5$, and $Nb_2O_5$;
providing one or more different capacitor dielectric layers intermediate the first phase dielectric metal oxide and the inner conductive capacitor electrode material;
depositing amorphous conductive $RuO_2$ over and into physical contact with the dielectric metal oxide layer;
after depositing the conductive $RuO_2$, annealing the $RuO_2$ and the dielectric metal oxide layer at a temperature below 500° C.; the $RuO_2$ in physical contact with the dielectric metal oxide during the annealing facilitating a change of the dielectric metal oxide layer from the first phase to a second crystalline phase having a higher k than the first phase;
after the annealing, etching utilizing an etch chemistry comprising $O_3$ to selectively remove at least some of the $RuO_2$; and
incorporating the annealed dielectric metal oxide layer into a capacitor dielectric region of a capacitor construction comprising the inner conductive capacitor electrode material and an outer conductive capacitor electrode material comprising the annealed conductive $RuO_2$.

2. The method of claim 1 wherein the $RuO_2$ at least prior to the annealing has a thickness of at least 50 Angstroms.

3. The method of claim 2 wherein the $RuO_2$ at least prior to the annealing has a thickness from 75 Angstroms to 300 Angstroms.

4. The method of claim 1 wherein the thickness of the dielectric metal oxide layer is no greater than 60 Angstroms.

5. The method of claim 4 wherein the thickness of the dielectric metal oxide layer is no greater than 50 Angstroms.

6. The method of claim 1 wherein the annealing is at a temperature of at least 200° C.

7. The method of claim 6 wherein the annealing temperature is no greater than 400° C.

8. The method of claim 1 wherein the $RuO_2$ as-deposited is amorphous and becomes crystalline from the annealing.

9. The method of claim 1 wherein,
the second crystalline phase is tetragonal; and
the $RuO_2$ as-deposited is amorphous, the annealing changing the phase of the $RuO_2$ to tetragonal.

10. The method of claim 1 wherein the first phase is crystalline.

11. The method of claim 1 wherein the first phase is amorphous.

12. The method of claim 1 wherein the second crystalline phase is tetragonal.

13. The method of claim 1 wherein the second crystalline phase is hexagonal.

14. A method of forming a capacitor, comprising:
depositing inner conductive capacitor electrode material comprising amorphous $RuO_2$ at an outermost portion thereof over a substrate;
depositing a dielectric metal oxide layer of a first phase to a thickness no greater than 75 Angstroms over and into physical contact with the $RuO_2$ of the inner conductive capacitor electrode material, the first phase dielectric metal oxide layer having a k of at least 15, the dielectric metal oxide layer comprising one or more of $TiO_2$, $HfO_2$, $ZrO_2$, $Ta_2O_5$, and $Nb_2O_5$;
depositing outer conductive capacitor electrode material comprising $RuO_2$ over the dielectric metal oxide layer;
annealing the $RuO_2$ of the inner conductive capacitor electrode material and the outer conductive capacitor electrode material and the dielectric metal oxide layer at a temperature below 500° C., the $RuO_2$ in physical contact with the dielectric metal oxide during the annealing facilitating a change of the dielectric metal oxide layer from the first phase to a second crystalline phase having a higher k than the first phase; and
after the annealing, etching utilizing an etch chemistry comprising $O_3$ to selectively remove at least some of the $RuO_2$ from the outer conductive capacitor electrode material.

15. The method of claim 14 wherein depositing the dielectric metal oxide layer at least starts by using an oxygen-containing precursor which is void of $O_3$.

16. The method of claim 15 wherein depositing the dielectric metal oxide layer uses $O_3$ after the inner conductive capacitor electrode material is covered with dielectric metal oxide using the oxygen-containing precursor which is void of $O_3$.

17. The method of claim 14 wherein the dielectric metal oxide layer only contains a single metal element.

18. The method of claim 14 wherein the dielectric metal oxide layer comprises one of $HfO_2$ and $Nb_2O_5$, and further comprises at least one of $ZrO_2$, $TiO_2$, and $Ta_2O_5$.

19. A method of forming a capacitor, comprising:
depositing inner conductive capacitor electrode material over a substrate, the inner conductive capacitor electrode material being selected from the group consisting of conductively doped silicon, elemental titanium, elemental tungsten, elemental ruthenium, elemental platinum, conductive metal oxides, and mixtures thereof;
depositing a dielectric metal oxide layer of a first phase to a thickness no greater than 75 Angstroms over the inner conductive capacitor electrode material, the first phase dielectric metal oxide layer having a k of at least 15 comprising one or more of $ZrO_2$, $TiO_2$, $HfO_2$, $Ta_2O_5$, and $Nb_2O_5$;

depositing amorphous conductive $RuO_2$ over and into physical contact with the dielectric metal oxide layer;

providing one or more different capacitor dielectric materials intermediate the dielectric metal oxide and the inner conductive capacitor electrode material;

after depositing the amorphous conductive $RuO_2$, annealing the $RuO_2$ and the dielectric metal oxide layer at a temperature below 500° C.; the $RuO_2$ in physical contact with the dielectric metal oxide during the annealing facilitating a change of the dielectric metal oxide layer from the first phase to a second crystalline phase having a higher k than the first phase;

after the annealing, utilizing an etch chemistry comprising $O_3$ to selectively remove at least some of the $RuO_2$ from the substrate; and after the etching, depositing outer conductive capacitor electrode material over the annealed dielectric metal oxide layer.

20. The method of claim 19 wherein the etching removes all of the $RuO_2$ from the substrate.

21. A method of forming a capacitor, comprising:

depositing inner conductive capacitor electrode material comprising amorphous $RuO_2$ at an outermost portion thereof over a substrate;

depositing a dielectric metal oxide layer of a first phase to a thickness no greater than 75 Angstroms over and into physical contact with the $RuO_2$ of the inner conductive capacitor electrode material, the first phase dielectric metal oxide layer having a k of at least 15 and comprising 1 or more of $HfO_2$ and $Nb_2O_5$;

depositing amorphous conductive $RuO_2$ over and into physical contact with the dielectric metal oxide layer;

after depositing the conductive $RuO_2$ over the dielectric metal oxide layer, annealing the $RuO_2$ of the inner conductive capacitor electrode material and over the dielectric metal oxide, and the dielectric metal oxide layer at a temperature below 500° C.; the $RuO_2$ over and under, and in physical contact with, the dielectric metal oxide during the annealing facilitating a change of the dielectric metal oxide layer from the first phase to a second crystalline phase having a higher k than the first phase;

after the annealing, etching utilizing an etch chemistry comprising $O_3$ to selectively remove at least some of the $RuO_2$ from over the dielectric metal oxide; and incorporating the annealed dielectric metal oxide layer into a capacitor dielectric region of a capacitor construction comprising the inner conductive capacitor electrode material comprising $RuO_2$ and an outer conductive capacitor electrode material comprising the conductive $RuO_2$ which was deposited over and into physical touching contact with the dielectric metal oxide layer.

22. A method of forming a capacitor, comprising:

depositing inner conductive capacitor electrode material comprising amorphous $RuO_2$ at an outermost portion thereof over a substrate;

depositing a first dielectric metal oxide layer of a first phase to a thickness no greater than 75 Angstroms over and into physical contact with the $RuO_2$ of the inner conductive capacitor electrode material, the first phase dielectric metal oxide layer having a k of at least 15;

depositing a second dielectric layer over the first dielectric metal oxide layer, the second dielectric layer being of different composition from that of the first dielectric metal oxide layer;

depositing a third dielectric metal oxide layer to a thickness no greater than 75 Angstroms over the second dielectric layer, the third dielectric metal oxide layer being of different composition from that of the second dielectric layer, the third dielectric metal oxide layer having a k of at least 15;

depositing amorphous conductive $RuO_2$ over and into physical contact with the third dielectric metal oxide layer;

after depositing the amorphous conductive $RuO_2$, annealing the substrate at a temperature below 500° C.; the $RuO_2$ in physical contact with the first dielectric metal oxide layer during the annealing facilitating a change of the first dielectric metal oxide layer from the first phase to a second crystalline phase having a higher k than the first phase; the $RuO_2$ in physical contact with the third dielectric metal oxide layer during the annealing facilitating a change of the third dielectric metal oxide layer from a third phase to a fourth crystalline phase having a higher k than the third phase;

after the annealing, etching to remove at least some of the $RuO_2$ from over the third dielectric metal oxide; and incorporating the annealed first, second and third dielectric layers into a capacitor dielectric region of a capacitor construction comprising the inner conductive capacitor electrode material comprising $RuO_2$ and an outer conductive capacitor electrode material comprising the conductive $RuO_2$ which was deposited over and into physical touching contact with the third dielectric metal oxide layer.

23. The method of claim 22 wherein the first and third dielectric metal oxide layers are of the same composition.

24. The method of claim 22 wherein the first and third dielectric metal oxide layers are of different compositions.

* * * * *